(12) United States Patent
Brenneman et al.

(10) Patent No.: US 7,731,831 B2
(45) Date of Patent: Jun. 8, 2010

(54) METHOD FOR MANUFACTURING A COMPOSITE MATERIAL INCLUDING COPPER FOIL AND SUPPORT LAYER

(75) Inventors: William L. Brenneman, Cheshire, CT (US); Szuchain F. Chen, Hamden, CT (US)

(73) Assignee: GBC Metals, L.L.C., East Alton, IL (US)

( * ) Notice: Subject to any disclaimer, the term of this patent is extended or adjusted under 35 U.S.C. 154(b) by 732 days.

(21) Appl. No.: 11/593,949

(22) Filed: Nov. 7, 2006

(65) Prior Publication Data

US 2007/0141380 A1 Jun. 21, 2007

Related U.S. Application Data

(63) Continuation of application No. 10/965,347, filed on Oct. 14, 2004, now Pat. No. 7,132,158.

(60) Provisional application No. 60/513,367, filed on Oct. 22, 2003.

(51) Int. Cl.
*C25D 1/04* (2006.01)
*C25D 1/20* (2006.01)

(52) U.S. Cl. .................. 205/76; 205/77; 205/227

(58) Field of Classification Search ........... 205/76, 205/77
See application file for complete search history.

(56) References Cited

U.S. PATENT DOCUMENTS

| 454,381 | A | 6/1891 | Reinfeld | 205/76 |
|---|---|---|---|---|
| 3,998,601 | A | 12/1976 | Yates et al. | 29/195 |
| 4,088,544 | A | 5/1978 | Hutkin | 204/12 |
| 4,169,018 | A | 9/1979 | Berdan et al. | 204/33 |
| 4,357,395 | A | 11/1982 | Lifshin et al. | 428/607 |
| 4,499,152 | A | 2/1985 | Green et al. | 427/123 |

(Continued)

FOREIGN PATENT DOCUMENTS

EP 208177 10/1987

(Continued)

OTHER PUBLICATIONS

"Olin C7025," including Table 1, from www.olinbrass.com, Apr. 16, 2006.

(Continued)

*Primary Examiner*—Patrick Ryan
*Assistant Examiner*—William T Leader
(74) *Attorney, Agent, or Firm*—Harness, Dickey & Pierce, P.L.C.

(57) ABSTRACT

A composite material useful for the manufacture of a circuit has a support layer, a metal foil layer having opposing first and second sides and a thickness of 15 microns or less and a release layer effective to facilitate separation of the metal foil layer from the support layer, the release layer disposed between and contacting both the support layer and the metal foil layer. A reactive element containing layer, which may be the support layer, effective to react with gaseous elements or compounds to form thermally stable compounds contacts the release layer. The composite material is preferably subjected to a low temperature heat treatment. The combination of the low temperature heat treatment and the reactive element containing layer results in reduced defects including blisters in the copper foil during subsequent processing.

9 Claims, 2 Drawing Sheets

U.S. PATENT DOCUMENTS

| | | | | |
|---|---|---|---|---|
| 4,503,112 | A | 3/1985 | Konicek | 428/216 |
| 4,515,671 | A | 5/1985 | Polan et al. | 204/228 |
| 4,568,413 | A | 2/1986 | Toth et al. | 156/151 |
| 4,997,517 | A | 3/1991 | Parthasarathi | 156/630 |
| 5,049,221 | A | 9/1991 | Wada et al. | 156/151 |
| 5,066,366 | A | 11/1991 | Lin | 204/12 |
| 5,071,520 | A | 12/1991 | Lin et al. | 205/155 |
| 5,096,522 | A | 3/1992 | Kawachi et al. | 156/151 |
| 5,114,453 | A | 5/1992 | Ross et al. | 428/607 |
| 5,230,932 | A | 7/1993 | Chen et al. | 205/152 |
| 5,322,975 | A | 6/1994 | Nagy et al. | 174/257 |
| 5,447,619 | A | 9/1995 | Wolski et al. | 205/50 |
| 5,617,629 | A | 4/1997 | Ekstrom | 29/846 |
| 5,779,870 | A | 7/1998 | Seip | 205/77 |
| 5,800,930 | A | 9/1998 | Chen et al. | 428/607 |
| 6,132,887 | A * | 10/2000 | Clouser et al. | 428/606 |
| 6,183,880 | B1 | 2/2001 | Yoshioka et al. | 428/607 |
| 6,235,404 | B1 | 5/2001 | Frater | 428/607 |
| 6,238,778 | B1 | 5/2001 | Schneider | 428/209 |
| 6,270,889 | B1 | 8/2001 | Kataoka et al. | 428/352 |
| 6,346,335 | B1 | 2/2002 | Chen et al. | 428/629 |
| 6,447,929 | B1 | 9/2002 | Wang et al. | 428/604 |
| 6,500,566 | B1 | 12/2002 | Smith | 428/626 |
| 6,544,663 | B1 * | 4/2003 | Nakano et al. | 428/606 |
| 6,569,543 | B2 | 5/2003 | Brenneman et al. | 428/607 |
| 6,596,391 | B2 | 7/2003 | Smith | 428/344 |
| 6,630,036 | B2 * | 10/2003 | Saita et al. | 148/23 |
| 6,689,268 | B2 | 2/2004 | Chen et al. | 205/171 |
| 7,026,059 | B2 | 4/2006 | Suzuki et al. | 428/626 |
| 7,049,007 | B2 | 5/2006 | Gales et al. | 428/607 |
| 2002/0192486 | A1 * | 12/2002 | Chen et al. | 428/607 |
| 2003/0031867 | A1 * | 2/2003 | Ogura et al. | 428/355 R |
| 2003/0035948 | A1 * | 2/2003 | Fujimaru et al. | 428/343 |

FOREIGN PATENT DOCUMENTS

| | | |
|---|---|---|
| EP | 001331088 A1 | 7/2003 |
| WO | WO02/24444 | 3/2002 |

OTHER PUBLICATIONS

IPC, "Metal Foil for Printed Wiring Applications", Metallic Foils task Group STandard IPC-4562 2/00, pp. 1-20, Feb. 2000.

* cited by examiner

METHOD FOR MANUFACTURING A COMPOSITE MATERIAL INCLUDING COPPER FOIL AND SUPPORT LAYER

CROSS REFERENCE TO RELATED PATENTS

This application is a continuation of U.S. patent application Ser. No. 10/965,347, filed on Oct. 14, 2004, now issued as U.S. Pat. No. 7,132,158, which relates to and claims priority to U.S. Provisional Patent Application Ser. No. 60/513,367 for "Support Layer for Thin Copper Foil" that was filed on Oct. 22, 2003. In addition, this patent application relates to U.S. Pat. No. 6,346,335, "Copper Foil Composite Including a Release Layer" and U.S. Pat. No. 6,569,543, "Copper Foil with Low Profile Bond Enhancement." The subject matters of the provisional patent application and both U.S. patents are incorporated by reference herein in their entireties.

BACKGROUND OF THE INVENTION

1. Field of the Invention

This invention relates to a copper foil for use in the manufacture of printed circuit boards and flexible circuits. More particularly, a composite material includes a copper foil layer and a support layer with a release layer disposed between the copper foil and the support layer. Contacting the release layer with a reactive element at an elevated temperature reduces blister formation during subsequent assembly steps.

2. Description of Related Art

Composite materials used for the manufacture of printed circuits and flexible circuits are described in the above-referenced U.S. Pat. Nos. 6,346,335 and 6,569,543. A support layer, typically formed from copper, is coated with a release layer. The copper foil layer is formed on the release layer, typically by electrolytic deposition. Adhesion between the release layer and the copper foil layer is high enough so that the copper foil layer does not separate from the support layer prematurely, but is sufficiently low that separation of the support layer following lamination does not tear or otherwise damage the copper foil layer. Typical release layers include an admixture of a metal selected from the group consisting of chromium, nickel, titanium, copper, manganese, iron, cobalt, tungsten, molybdenum, tantalum and mixtures thereof and a non-metal selected from the group consisting of oxides, phosphate and chromates of those metals. One preferred release layer is an admixture of chromium and chromium oxide.

For the manufacture of printed circuits, the composite material is laminated to a glass-filled epoxy-type board with the copper foil layer contacting the epoxy board. A combination of heat (typically between 180° C. and 250° C.) and pressure (typically between 200 psi and 300 psi) bonds the copper foil layer to the epoxy board. The support layer and release layer are then peeled away from the epoxy board/copper foil assembly.

For the manufacture of flexible circuits or high temperature application devices, the copper foil is sometimes laminated in the absence of pressure. The copper foil is coated with a polymer dielectric, such as polyimide. The coated composite material is then dried and cured at a temperature of between 180° C. and 400° C., for example 360° C. for 30 minutes in a nitrogen atmosphere at one atmosphere of pressure. After curing, the support layer and release layer are then peeled away from the polymer dielectric copper foil assembly.

It is important that when the support layer is peeled from the copper foil layer that the copper foil layer is defect free. One such defect that has been reported is blisters on the surface of the copper foil layer that previously contacted the support layer. These blisters are believed to originate when gasses are evolved at the support layer/copper foil interface and then expand with increasing temperature during the dielectric curing process. The blisters are typically a few thousandths of an inch in diameter with a frequency ranging from a few to several thousand per square foot. Upon separation from the support layer, the blisters leave depressions in the surface of the laminated copper foil. These small depressions render those regions of the laminate unacceptable for the processing of fine-line circuits.

There remains a need for a process to manufacture flexible circuits that reduces or eliminates the formation of such blisters.

IN THE DRAWINGS

DETAILED DESCRIPTION OF THE INVENTION

Figure 1:
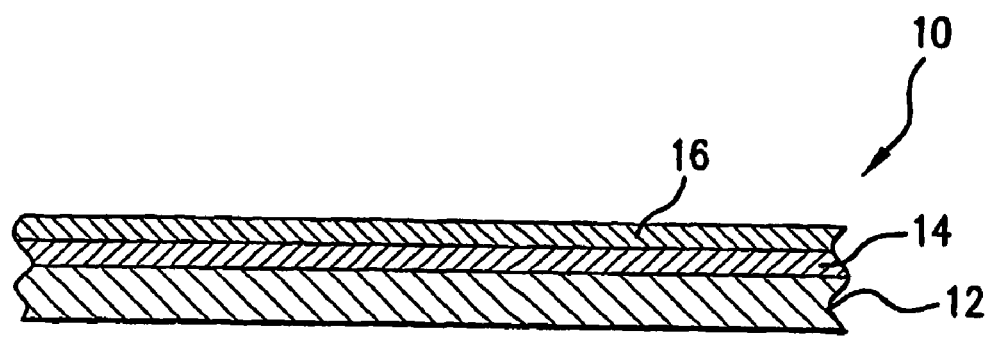
FIG. 1 illustrates in cross-sectional representation a composite material in accordance with a first embodiment of the invention.

FIG. 1 illustrates in cross-sectional representation a composite material 10 in accordance with a first embodiment of the invention. The composite material includes a support layer 12 that may be any electrically conductive material, such as copper, copper alloys, aluminum, aluminum alloys and stainless steel. Typically, the support layer has a thickness of from 17 μm to 70 μm. A preferred material for the support layer 12 is a wrought copper alloy that contains at least one reactive element. Examples of commercial copper alloys having these requirements for the support layer 12 include copper alloy C199 (nominal composition by weight is 2.9%-3.4% titanium, balance copper), copper alloy C7025 (nominal composition by weight is 2.2%-4.2% nickel, 0.25%-1.2% silicon, 0.05%-0.30% magnesium and the balance copper), and copper alloy C654 (nominal composition by weight is 1.2%-1.9% tin, 2.7%-3.4% silicon, 0.01%-0.12% chromium and the balance copper).

Exemplary other copper-base alloys, and their nominal compositions by weight, include C15100—0.05%-0.15% zirconium an the balance (minimum 99.85%) is copper; C18100 0.40%-1.2% chromium, 0.03%-0.06% magnesium, 0.08%-0.20% zirconium, balance (minimum 98.7%) copper; C728—9.5%-10.5% nickel, 7.5%-8.5% tin, 0.10%-0.30% niobium, 0.05%-0.30% manganese, 0.005%-0.15% magnesium and the balance is copper; C7026—1.0%-3.0% nickel, 0.2%-0.7% silicon and the balance is copper; and NK120—0.01%-0.4% chromium, 0.01%-0.25% zirconium, 0.02%-2.0% zinc and the balance is copper.

Non-copper-base substrates useful in accordance with the invention, and their nominal compositions by weight, include aluminum alloy 2219—5.8%-6.8% copper, 0.2%-0.4% manganese, 0.05%-0.15% vanadium, 0.02%-0.10% titanium, 0.1%-0.25% zirconium and the balance is aluminum and stainless steel 32100—17.0%-19.0% chromium, 9.0%-12.0% nickel, maximum of 0.08%, 5×(minimum percent C) of titanium, and the balance is iron.

Use of these alloys is effective to reduce the number of blisters that form, particularly in those applications where blisters are prone to form, such as lamination in the absence of pressure. The mechanism that causes a reduction in blistering is not known. It is believed that one or more of the following cause a reduction in blistering: when alloyed with the support layer material, the reactive elements increase the tensile strength of the support layer such that there is less flexing during processing; when alloyed with the support layer material, the reactive elements change the coefficient of thermal expansion of the support layer; and when either alloyed with the support layer material or coated on a surface of the support layer, the substrate alloy or its constituent phases react with gaseous elements or compounds such as moisture that may form at the release layer interface to suppress blister formation. For example, hydrogen if evolved, would dissolve in the substrate or react to form a hydride by combination with a reactive element. The alloying elements to provide these beneficial effects are preferably selected from the group consisting of titanium, zirconium, barium, magnesium, silicon, niobium, calcium and mixtures thereof.

The reactive alloying elements are present in an amount, by weight, of from 0.001% to 50% and preferably in an amount of from 0.1% to 5%. It is desired for there to be a sufficient quantity to provide the copper alloy with a tensile strength in excess of 30 ksi after being exposed to a lamination temperature of in excess of 180° C. This facilitates handling of the composite material, protects the thin copper foil layer from wrinkles and mechanical damage and can be used as a protective sheet in the circuit board fabrication process, such as for hole punching.

Release layer 14 is disposed between the support layer 12 and a copper foil layer 16. The release layer 14 is selected such that adhesion between the release layer 14 and the copper foil layer 16 is high enough so that the copper foil layer does not separate from the support layer 12 prematurely, but is sufficiently low that separation of the support layer following lamination does not tear or otherwise damage the copper foil layer. Typical release layers include an admixture of a metal selected from the group consisting of chromium, nickel, titanium, copper, manganese, iron, cobalt, tungsten, molybdenum, tantalum and mixtures thereof and a non-metal selected from the group consisting of oxides, phosphates and chromates of those metals. One preferred release layer is an admixture of chromium and chromium oxide.

Copper foil layer 16 is electrolytically deposited onto the release layer from any suitable electrolyte, such as an aqueous alkaline or acid solution containing copper ions in the form of for example copper sulfate and/or copper pyrophosphate as disclosed in published US patent application US2002/0192486, "Copper Foil with Low Profile Bond Enhancement," that is incorporated by reference herein in its entirety. The copper foil layer is thin, on the order of 15 microns in thickness or less and preferably, the thickness is from 0.2 μm to 8.0 μm.

Figure 2:
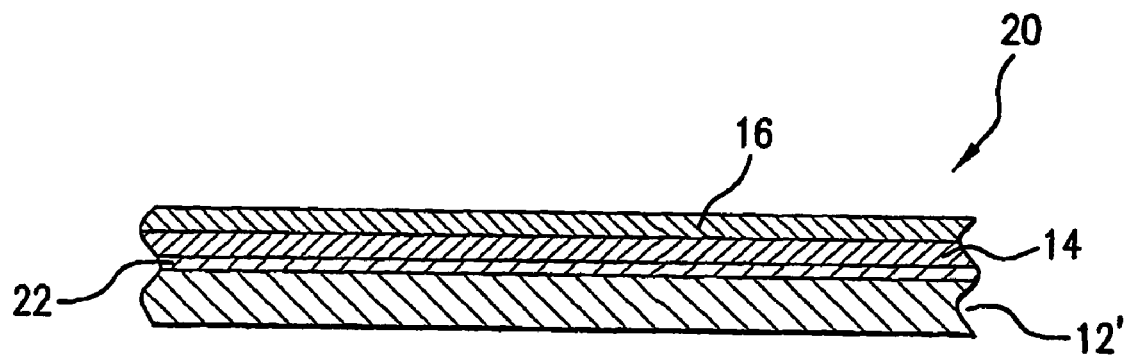
FIG. 2 illustrates in cross-sectional representation, a composite material in accordance with a second embodiment of the invention.

FIG. 2 illustrates in cross-sectional representation a composite material 20 in accordance with a second embodiment of the invention. The composite material 20 has a copper foil layer 16 and release layer 14 as in the previous embodiment. The support layer 12' need not include a reactive element, although a high tensile strength, in excess of 30 ksi, after exposure to the lamination temperature is still beneficial. Disposed between the support layer 12' and the release layer 14 is a reactive element-containing layer 22. The reactive element is selected from those recited above and the layer may be deposed by any suitable method, such as chemical vapor deposition, physical vapor deposition, electroplating, sputtering and plasma spray. The thickness of the reactive element-containing layer 22 is from 10 Å to 2 μm.

Figure 3:
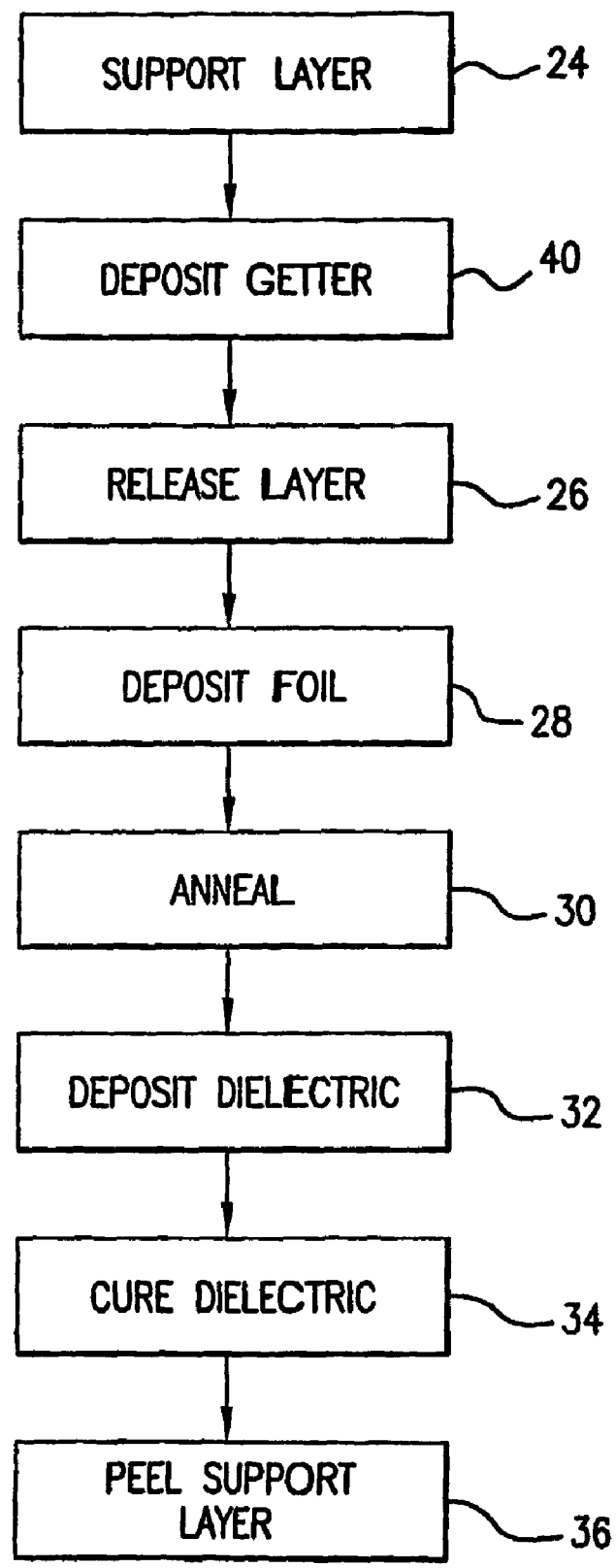
FIG. 3 illustrates in flow chart format a method for the manufacture of a flexible foil using the composite materials of the invention.

FIG. 3 illustrates in flow chart representation, a method for the manufacture of the composite material of the invention. In accordance with the embodiment illustrated in FIG. 1, a support layer, such as a copper-base alloy (by base it is meant the alloy contains at least 50% by weight of the recited element, copper) containing at least one reactive element is coated 26 with a release layer. A copper foil layer is deposited 28 onto the release layer.

The composite material may then, preferably, be subjected to a heat treatment 30 that is at a temperature which is less than the lamination temperature, such as from about 100° C. to about 350° C. for up to about 48 hours in a nitrogen or forming gas (by volume 96% $N_2$-4% $H_2$) atmosphere. By "about" it is meant that exactitude is not desired and values are ±20%. This heat treatment may be in one or several stages. An exemplary one stage heat treatment 30 is at a temperature of from about 100° C. to about 240° C. for from about 8 hours to about 24 hours. An exemplary two stage heat treatment is a first stage of about 150° C. to about 200° C. for from about 15 hours to about 25 hours followed by about 200° C. to 250° C. for from about ½ hour to about 5 hours.

After the heat treatment 30, a polymer dielectric is deposited 32 onto a surface of the copper foil layer. Exemplary polymer dielectrics include epoxy, polyimide, polytetrafluoroethylene (Teflon) and mixtures thereof. The deposition is by any suitable method such as gravure-roll coating, nip-roll lamination, doctor's blade, spraying or immersion. The polymer dielectric is then dried and cured 34 by heating to an effective temperature for curing, such as 180° C. to 380° C. for from 0.1 hours to 6 hours. Typically, blistering is more pronounced and the benefits of the invention more necessary when the lamination utilizes heat but not pressure.

Figure 4:
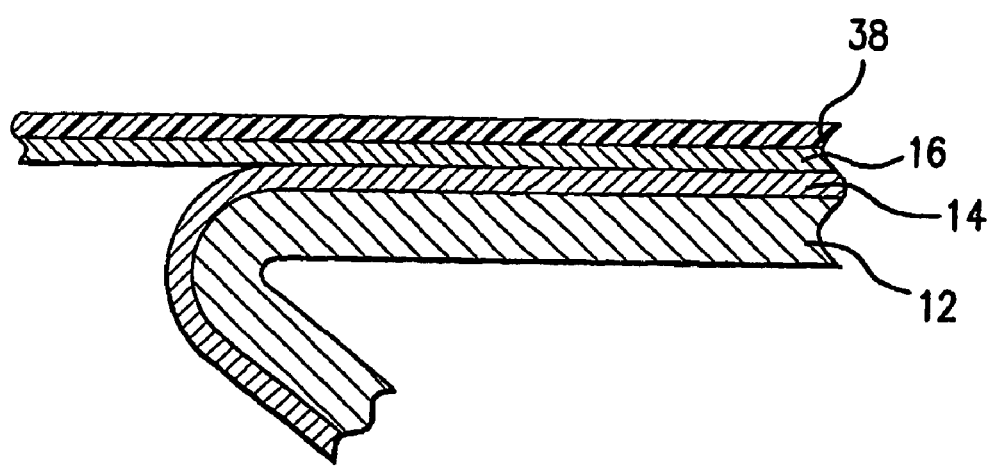
FIG. 4 illustrates in cross-sectional representation a flexible foil manufactured from the composite material of the invention.

The cured polymer dielectric 38/copper foil assembly 16 is then peeled from the release layer 14/support layer 12 as illustrated in cross-sectional representation in FIG. 4. Referring back to FIG. 3, the step of peeling 36 may occur either before or after the copper foil layer is imaged into a desired pattern of circuits, such as by photolithography.

A similar process flow is effective to manufacture the composite material illustrated in FIG. 2 with the addition of the step of depositing a reactive element-containing layer 40 onto a surface of the support layer.

While blistering is best reduced or eliminated by the contacting of a reactive element containing-layer with the release layer, some reduction in the amount of blistering is obtained by the low temperature anneal, even without the inclusion of a reactive element containing component.

The benefits of the above embodiments will be better understood by the Example that follows.

EXAMPLE

Support layers having the compositions and thicknesses recited in Table 1 were coated with a release layer having a thickness of between about 12 Å and about 200 Å and a nominal composition that was a mixture of chromium oxides, chromium, and chromium hydroxides. The release layer was deposited by electrodeposition. A copper foil layer having a nominal thickness of 5 μm was deposited by electrodeposition. The so-formed composite was then heated to 170° C. in an air, nitrogen or forming gas atmosphere for the time recited in Table 1.

The annealed samples were then heated to 360° C. for 30 minutes in a nitrogen atmosphere to simulate a cure cycle for a dielectric. The occurrence and density of blisters was then rated qualitatively to anticipate the quality of imaged copper foil circuit traces on a circuit board, where: 00=excellent; 0=good; Δ=fair; X=poor; and N.R.=not rated. The results are reported in Table 1.

TABLE 1

| Support Layer | Support Layer Thickness | Rating following a heat treatment for the specified time at 170° C. followed by 360° C. for 30 minutes bake test | | | | |
|---|---|---|---|---|---|---|
| | | 0 hr | 2 hr | 5 hr | 8 hr | 24 hr |
| C110 | 36 μm | X | Δ | X | N.R. | 0 |
| C194 | 36 μm | X | 0 | N.R. | N.R. | 0 |
| C199 | 198 μm | X | N.R. | 0 | 00 | 00 |
| C7025 | 36 μm | X | N.R. | N.R. | N.R. | 00 |
| C7025 | 18 μm | Δ | N.R. | N.R. | N.R. | 00 |
| C654 | 381 μm | X | 0 | N.R. | N.R. | 0 |

Table 1 illustrates that when the substrate contains a reactive element, such as titanium, silicon or magnesium, and the composite material is heat treated, blistering is substantially eliminated. While the low temperature anneal reduces blistering in a non-reactive element containing alloy (i.e. C110), the improvement is not as pronounced.

It is apparent that there has been provided in accordance with the present invention a composite material and a method to manufacture that composite material such that blister defect formation is reduced during circuit board processing, and that fully satisfies the objects, means and advantages set forth hereinabove. While the invention has been described in combination with embodiments thereof, it is evident that many alternatives, modifications and variations will be apparent to those skilled in the art in light of the foregoing description. Accordingly, it is intended to embrace all such alternative, modifications and variations as fall within the spirit and broad scope of the appended claims.

What is claimed is:

1. A method for manufacturing a composite material, comprising the steps of: providing a support layer; depositing a reactive element containing layer having a reactive element selected from the group consisting of titanium, zirconium, barium, magnesium, silicon, niobium, calcium and mixtures thereof on a surface of said support layer; depositing a release layer on said coated surface of said support layer: electrolytically depositing a copper foil layer on said release layer whereby a first side of said copper foil layer contacts said release layer; and subjecting the support layer, reactive element containing layer, release layer and copper foil layer to an annealing heat treatment prior to application of a polymer dielectric to the copper foil layer, by heating said composite material at a temperature of from about 100° C. to about 350° C. for up to 48 hours.

2. The method of claim 1 wherein said heating step is a single stage at a temperature of from about 100° C. to about 240° C. for from about 8 hours to about 24 hours.

3. The method of claim 1 wherein said heating step is in two stages with a first stage at a temperature of from about 150° to about 200° C. for from about 15 hours to about 25 hours followed by a second stage at a temperature of from about 200° C. to about 250° C. for from about ½ hour to about 5 hours.

4. The method of claim 1 including the further step of coating an opposing second side of said copper foil layer with a polymeric dielectric; and curing said polymer dielectric at a cure temperature that is greater than the temperature of said annealing step.

5. The method of claim 4 wherein said cure temperature is from about 180° C. to about 380° C.

6. The method of claim 5 wherein said step of curing said polymeric dielectric occurs in the absence of a lamination pressure.

7. The method of claim 5 wherein said polymeric dielectric is selected from the group consisting of epoxy, polyimide, polytetrafluoroethylene (Teflon) and mixtures thereof.

8. The method of claim 5 wherein said reactive element is deposited by a method selected from the group consisting of chemical vapor deposition, physical vapor deposition, electroplating, sputtering and plasma spray.

9. The method of claim 8 wherein said reactive element is deposited to a thickness of from about 10 Angstrom to about 2 μm.

* * * * *